United States Patent
Yu et al.

(10) Patent No.: US 6,307,901 B1
(45) Date of Patent: Oct. 23, 2001

(54) TURBO DECODER WITH DECISION FEEDBACK EQUALIZATION

(75) Inventors: Xiaoyong Yu, Grayslake; Ming Tan, Gurnee; Mang Zhu, Vernon Hills, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/563,064

(22) Filed: Apr. 24, 2000

(51) Int. Cl.[7] .................................................. H03M 13/23
(52) U.S. Cl. ........................ 375/341; 375/233; 714/786; 714/794
(58) Field of Search .................................. 375/233, 262, 375/265, 340, 341, 346, 348; 714/755, 759, 760, 774, 786, 794, 795

(56) References Cited

U.S. PATENT DOCUMENTS

| | | | |
|---|---|---|---|
| 5,933,462 | 8/1999 | Viterbi et al. ........................ | 375/341 |
| 5,970,085 | * 10/1999 | Yi ........................................... | 370/342 |
| 6,044,116 | * 3/2000 | Wang .................................... | 375/265 |
| 6,145,114 | * 11/2000 | Crozier et al. ....................... | 714/794 |
| 6,166,667 | * 12/2000 | Park ....................................... | 341/94 |
| 6,182,261 | * 1/2001 | Haller et al. .......................... | 714/758 |
| 6,223,319 | * 4/2001 | Ross et al. ............................ | 714/755 |
| 6,233,709 | * 5/2001 | Zhang et al. ......................... | 714/774 |

FOREIGN PATENT DOCUMENTS

| | | |
|---|---|---|
| 99 04598 | * 10/2000 | (FR) . |
| WO 00/44100 | * 7/2000 | (WO) . |
| WO 00/52832 | * 9/2000 | (WO) . |

OTHER PUBLICATIONS

Douillard et al., "Iterative Correction of Intersymbol Interference: Turbo–Equalization", European Trans. Telecom., vol. 6, No. 5, Sep.–Oct. 1995, pp. 507–511.

Raphaeli et al., "Combined Turbo Equalization and Turbo Decoding", IEEE Communication Letters, vol. 2, No. 4, Apr. 1998, pp. 107–109.

Berrou et al. "Near Shannon Limit Error–Correcting Coding and Decoding: Turbo–Codes(1)", Proc. ICC, 1993, pp. 1064–1070.

Hangenaur et al., "Iterative Decoding of Binary Block and Convolutional Codes", IEEE Trans. Inform. Theory, vol. 42, No. 2, Mar. 1996, pp. 429–445.

* cited by examiner

Primary Examiner—Young T. Tse
(74) Attorney, Agent, or Firm—Brian M. Mancini

(57) ABSTRACT

A decoder equalizes a turbo coded signal with intersymbol interference by performing a decision-feedback equalization in each iteration of the turbo decoding process. In such iteration process, two recursion processors calculate soft output values for the information bits and the coded bits of the signal as well. Hard output values are derived from the soft output values. A decision feedback equalizer in an iterative loop of the decoder receives the hard output values uses these to provide a correction for the intersymbol interference. Thereafter, the decision feedback signal applies the correction signal to the input signal to minimize the intersymbol interference.

18 Claims, 5 Drawing Sheets

— PRIOR ART —

— PRIOR ART —

— PRIOR ART —

— PRIOR ART —

TURBO DECODER WITH DECISION FEEDBACK EQUALIZATION

FIELD OF THE INVENTION

This invention relates generally to communication systems, and more particularly to a decoder for use in a receiver of a turbo coded communication system.

BACKGROUND OF THE INVENTION

Convolutional codes are often used in digital communication systems to protect transmitted information from error. Such communication systems include the Direct Sequence Code Division Multiple Access (DS-CDMA) standard IS-95, the Global System for Mobile Communications (GSM), and next generation wideband communication systems. Typically in these systems, a signal is convolutionally coded into an outgoing code vector that is transmitted. At a receiver, a practical soft-output decoder, such as a Viterbi decoder as is known in the art, uses a trellis structure to perform an optimum search for the transmitted signal bits based on maximum likelihood criterion.

More recently, turbo codes have been developed that outperform conventional coding techniques. Turbo codes are generally composed of two or more convolutional codes and turbo interleavers. Turbo decoding is iterative and uses a soft output decoder to decode the individual convolutional codes. The soft outputs of one decoder feed into the next decoder or feedback to the first decoder when the decoding procedure iteratively approaches the converged final results. The soft output decoder is usually a MAP (maximum a posteriori) decoder which requires backward and forward recursions to determine the soft output. MAP derivatives are also available including log-MAP, max-log-MAP, soft-output Viterbi algorithm (SOVA), and constant-log-MAP algorithms, as are known in the art.

Turbo coding is efficiently utilized to correct errors in the case of communicating over an added white Gaussian noise (AWGN) channel. However, in the presence of intersymbol interference (ISI), the performance of turbo decoding is degraded. Some prior art methods have included equalization to mitigate ISI. However, these techniques are either too complicated to be implemented in practice or they introduce extra delay in receiver.

There is a need for a decoder that reduces errors due to distortion in ISI channels, and in particular, there is a need for an improved decoder that can equalize an ISI channel to reduce errors without introducing any additional delay. It would also be of benefit to provide a decoder with a minimal increase of circuitry or computational complexity.

DETAILED DESCRIPTION OF THE PREFERRED EMBODIMENT

The present invention provides a turbo decoder coupled with a decision feedback equalizer (DFE) so that the performance of the turbo decoding is improved for a turbo encoded signal transmitted over an ISI channel. Moreover, the present invention accomplishes this improvement without a great increase in complexity by including the DFE in the iterative loop.

Figure 1:
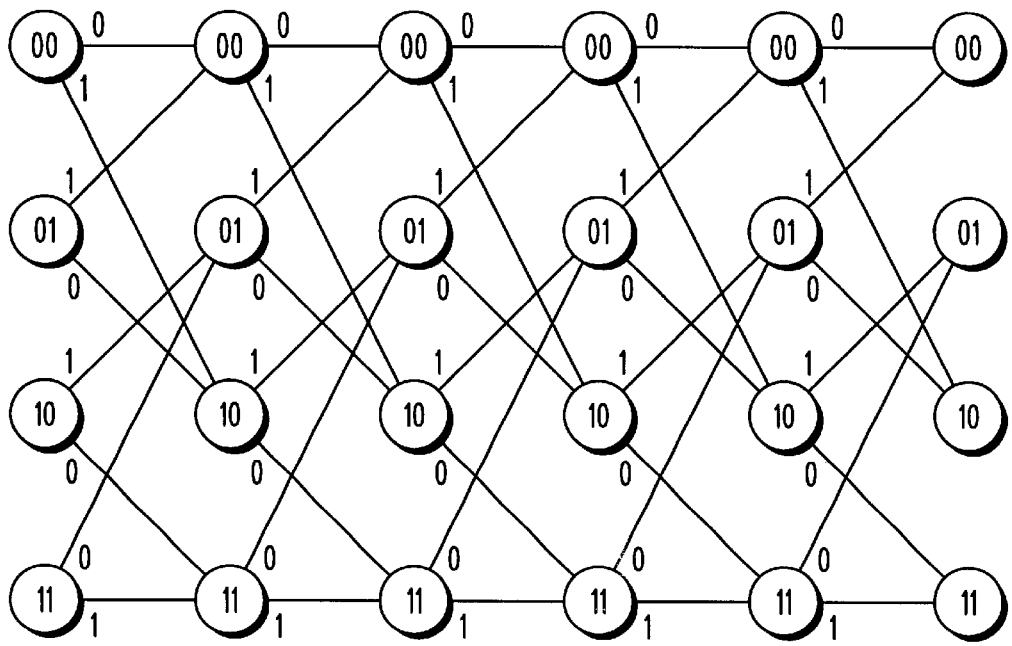
FIG. 1 shows a trellis diagram for convolutional encoding schemes as are known in the prior art.

Typically, convolutional codes, turbo codes, and others are graphically represented as a trellis as one shown in FIG. 1 where a four state, five section trellis is shown. For convenience, we will reference M states per trellis section and N trellis sections per block or frame. Maximum a posteriori type decoders (log-MAP, MAP, max-log-MAP, constant-log-MAP, etc.) utilize forward and backward generalized Viterbi recursions or soft output Viterbi algorithms (SOVA) on the trellis in order to provide soft outputs, as is known in the art. The MAP decoder minimizes the decoded bit error probability for each information bit based on all of the received signal in one encoding block or encoding frame.

Because of the Markov nature of the encoded sequence (wherein, given the current states, previous states cannot affect future states or future output branches), the a posterior bit probability can be broken into the past (beginning of trellis to the present section), the present (branch metric for the current section), and the future (end of trellis to current section). More specifically, the MAP decoder performs forward and backward recursions up to a present section wherein the past and future probabilities are used along with the present branch metric to generate an output decision. The principles of providing hard and soft output decisions on information bits are known in the art, and several variations of the described decoding methods exist. Most of the soft input-soft output (SISO) decoders considered for turbo codes are based on prior art MAP algorithms such as that presented in a paper by C. Berrou, A. Glavieux, and P. Thitimajshima, entitled "Near Shannon Limit Error-Correcting Coding and Decoding: Turbo-Codes (1)", Proceedings ICC, 1993, pp. 1064–1070. (Berrou algorithm).

Figure 2:
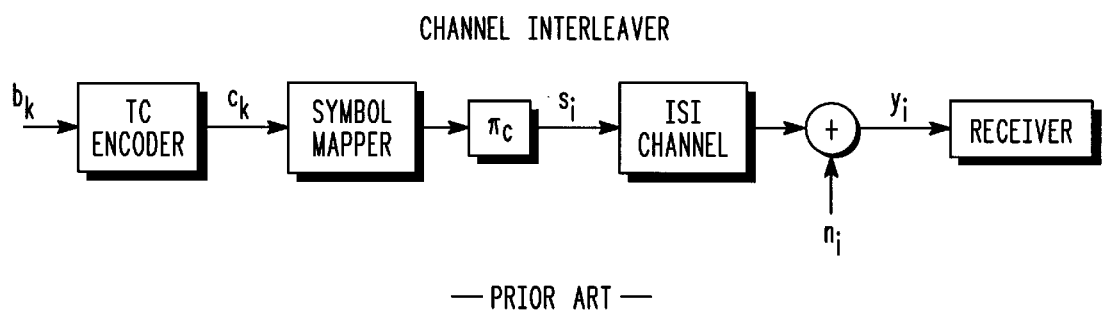
FIG. 2 shows a simplified block diagrams representing noise and distortion introduction in a coded signal, as is known in the prior art.

For simplicity and without loss of generality, we consider a digital equivalent baseband communication system depicted in FIG. 2, where the information sequence $b_k$ is turbo encoded, mapped to channel symbols $s_i$ which is either 1 or −1, passed through a channel interleaver $\pi_c$ and transmitted over a minimum phase ISI channel. At receiver end, the received signal $y_i$ is distorted and can be expressed as $$y_i = \sum_{j=0}^{L} h_j s_{i-j} + n_i$$

where $h_j$ represents channel impulse response, L denotes ISI length and $n_i$ is AWGN. Distortion due to ISI and AWGN increases the likelihood of bit errors when a receiver attempts to decode the signal to obtain the original information bits $b_k$. The use of turbo decoding alone in the receiver will successfully minimize bit error due to the AWGN, but something more is needed to minimize bit error due to ISI.

Figure 3:
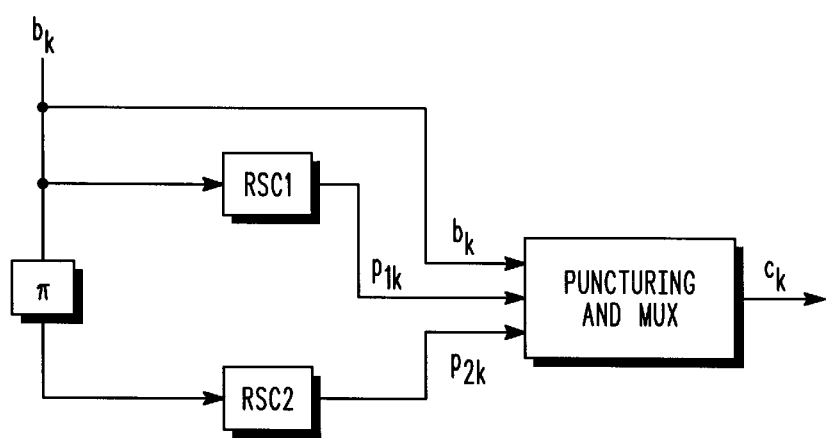
FIG. 3 shows a simplified block diagram for a turbo encoder as is known in the prior art.

FIG. 3 shows a typical turbo encoder that is constructed with one interleaver and two constituent codes which are recursive systematic convolutional (RSC) codes, but can be block codes also. As an example, here we only consider a turbo encoder which is a parallel concatenation of two RSCs with an interleaver π between them. However, this invention can be easily apply to other forms of turbo codes such as ones with more than two constituent codes and ones with serial concatenated convolutional codes (SCCC). The output $c_k$ of the turbo encoder is generated by multiplexing (concatenating) the information bits $b_k$ and parity bits $p_{1k}$ and $p_{2k}$ from the two encoders. Optionally, the parity bits can be punctured as is known in the art to increase code rate. As a particular case here, RSC has only one parity bit output. In general, the number of parity bits of the RSC can be more than one. However, the present invention can be easily applied to all other cases where the RSC has more than one parity bit.

Figure 4:
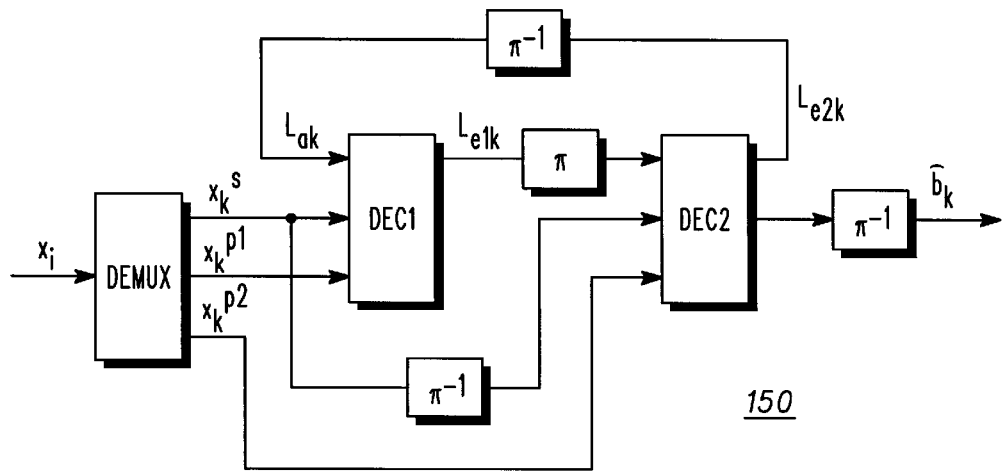
FIG. 4 shows a simplified block diagram for a turbo decoder as is known in the prior art.

Ignoring the effects of ISI and only considering an AWGN corrupted signal, denoted as $x_k$, for now, FIG. 4 shows a typical turbo decoder 150 that is constructed with interleaver, de-interleavers, and decoders. The mechanism of the turbo decoder regarding extrinsic information $L_{e1k}$, $L_{e2k}$, interleaver π, de-interleaver $π^{-1}$, and the iteration process between the decoders DEC1 and DEC2 follow prior art algorithms. In general, the input signal is channel-deinterleaved and applied to a demultiplexer to separate the samples corresponding to information bits and coded bits. Assuming zero decoder delay in the turbo decoder, the first decoder (DEC1) computes a soft output from the samples $x_k^s$, for information bits, and $x_k^{p1}$, for first coded bits and the a priori information ($L_{ak}$). The soft output is denoted as $L_{e1k}$, for extrinsic information from the first decoder. The second decoder (DEC2) is input with interleaved versions of $L_{e1k}$ (the a priori information for DEC2), the interleaved samples $x_k^s$, for information bits, and $x_k^{p2}$, for second coded bits. The second decoder generates extrinsic information, $L_{e2k}$, which is deinterleaved to produce $L_{ak}$ which is fed back to the first decoder. The above iteration is repeated for a predetermined number of times. Then a soft output (typically a log-likelihood ratio (LLR)) which provides an estimate of the original information bits $b_k$ is generated. For simplicity, we include a slicer, as is known in the art, inside the decoders such that the decoder final output is a hard decision about $b_k$, which is denoted by $\hat{b}_k$.

It is well known that MAP algorithms minimize the probability of error for an information bit given the received sequence, and they also provide the probability that the information bit is either a 1 or 0 given the received sequence. The algorithms provide a soft output value for each bit position (trellis section) wherein the influence on the current soft output within the block is broken into contributions from the past (earlier soft inputs), the present soft input, and the future (later soft inputs). This decoder algorithm requires a forward and a backward generalized Viterbi recursion on the trellis to arrive at an optimal soft output for each trellis section (stage). These a posteriori probabilities, or more commonly the log-likelihood ratio (LLR) of the probabilities, are passed between SISO decoding steps in iterative turbo decoding. The LLR for each information bit is $$L(b_k) = \ln \frac{\sum_{(m,n) \in B^1} \alpha_{k-1}(n)\gamma_k(n,m)\beta_k(m)}{\sum_{(m,n) \in B^0} \alpha_{k-1}(n)\gamma_k(n,m)\beta_k(m)}, \quad (1)$$

for all bits in the decoded sequence (k=1 to N). In equation (1), the probability that the decoded bit is equal to 1 (or 0) in the trellis given the received sequence is composed of a product of terms due to the Markov property of the code. The Markov property states that the past and the future are independent given the present. The present, $\gamma_k(n,m)$, represents the transition probability from state n at time k−1 to state m at time k, given the current received samples $u_k$, here $u_k$ denotes a pair of $(x_k^s, x_k^{p})$. The present plays the function of a branch metric. The past, $\alpha_{k-1}(m)$, is the probability of being in state m at time k−1 with the received sequence $\{u_1, \ldots, u_{k-1}\}$, and the future, $\beta_k(m)$, is probability of generating the received sequence $\{u_{k+1}, \ldots, u_N\}$ from state m at time k. The probability $\alpha_k(m)$ can be expressed as function of $\alpha_{k-1}(m)$ and $\gamma_k(n,m)$ and is called the forward recursion $$\alpha_k(m) = \sum_{n=0}^{M-1} \alpha_{k-1}(n)\gamma_k(n,m) \quad m = 0, \ldots, M-1, \quad (2)$$

where M is the number of states. The reverse or backward recursion for computing the probability $\beta_k(n)$ from $\beta_{k+1}(n)$ and $\gamma_k(n,m)$ is $$\beta_k(n) = \sum_{m=0}^{M-1} \beta_{k+1}(m)\gamma_k(n,m) \quad n = 0, \ldots, M-1. \quad (3)$$

The overall a posteriori probabilities in equation (1) are computed by summing over the branches in the trellis $B^1$ ($B^0$) that correspond to the information bit being 1 (or 0).

The LLR in equation (1) requires both the forward and reverse recursions to be available at time k. The prior art method for meeting this requirement is to compute and store the entire reverse recursion, and recursively compute $\alpha_k(m)$ and $L(b_k)$ from k=1 to k=N using $\alpha_{k-1}$ and $\beta_k$.

The above description, although effective with AWGN, does not consider the effects of ISI, as is done in the present invention. With an ISI distorted signal, $$y_i = \sum_{j=0}^{L} h_j x_{i-j} \quad (4)$$

as described previously, is input into the receiver, the present invention seeks to equalize out the distortion so as to reacquire the undistorted signal $x_i$ for use in decoding.

Figure 5:
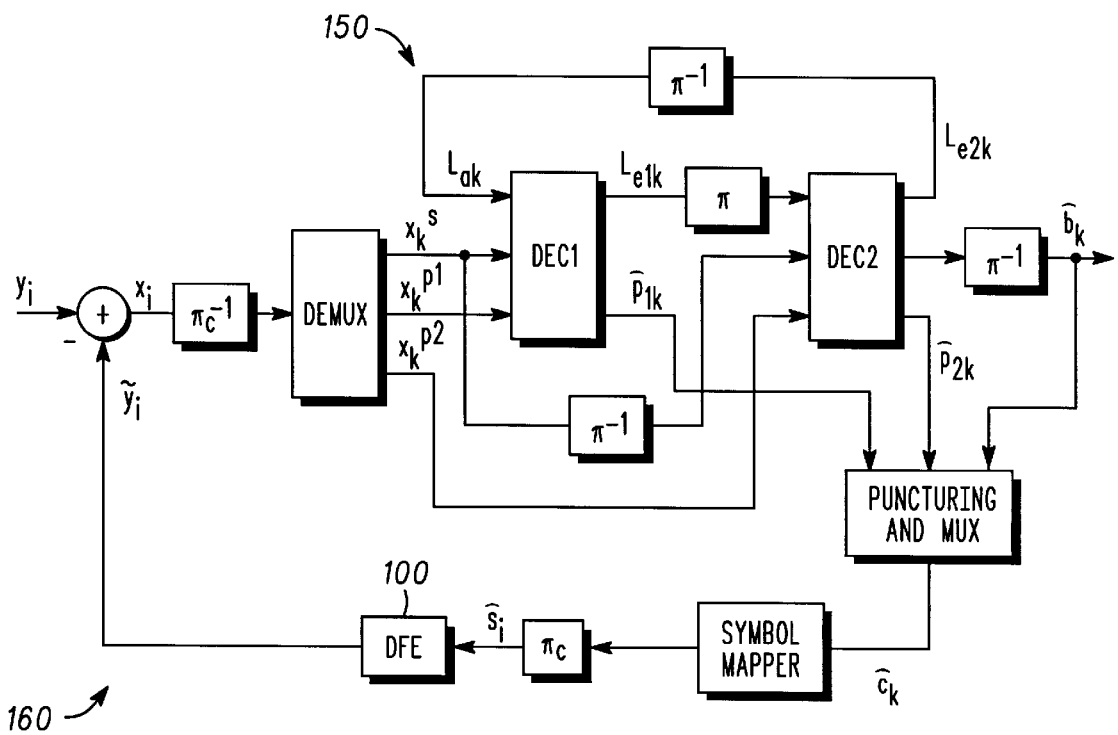
FIG. 5 shows a simplified block diagram for a turbo decoder with equalization, in accordance with the present invention.

FIG. 5 shows a turbo decoder with decision feedback equalization (DFE), in accordance with the present invention, that provides intersymbol interference equalization in decoding a received turbo coded input signal. The decoder includes a turbo decoder 150 and an equalizer feedback loop 160. The turbo decoder includes two constituent decoders connected in a typical iterative loop configuration. The turbo decoder decodes the information bits and coded bits of the input signal and calculates soft output values for the information bits and coded bits of the input signal. Typically, the coded bits are parity bits that may or may not be punctured, and the soft output values are LLR values. The recursion updates and soft outputs are calculated using a MAP algorithm or one of the MAP derivatives (i.e., log-MAP, max-log-MAP, constant-log-MAP, etc.), or a SOVA or Viterbi algorithm. Preferably, the constituent decoders are modified, such as with slicers for example, to provide hard decision values for the information bits and coded bits.

The equalizer feedback loop is coupled to the turbo decoder and is adapted to receive hard decision values for the coded and information bits from the turbo decoder as shown. The feedback loop includes an decision feedback equalizer 100 that inputs the hard decision on each symbol along with updated estimates of channel characteristics derived from the previous frame to calculate intersymbol interference correction signal. The decision feedback signal applies a correction to the next input of the signal before being input to the turbo decoder 150 so as to minimize the intersymbol interference.

In a preferred embodiment, the equalizer is implemented in an iterative loop of the turbo decoder, and the values applied to the equalizer are calculated in each turbo decoding iteration. The recursion processors use a LLR value calculated for the information and coded bits to derive a hard decision value that is applied to the equalizer. More preferably, the LLR coefficients ($\alpha$, $\beta$ and $\gamma$) used for calculating LLR of information bits are reused in the calculation of the LLR of the coded bits, therefore reducing the total computation. The feedback equalizer operates on multiplexed and interleaved symbols constructed from the hard decisions of the coded and information bits to provide an equalization signal that is subsequently summed with the input signal and deinterleaved before application to the turbo decoder.

One novel aspect of the present invention is having the equalization implemented in the iterative loop of the turbo decoder. Another novel aspect of the present invention is to supply hard output decisions from the turbo decoder for both the information bits and the coded bits to the equalizer. A further novel aspect is the reuse of the past, the present and the future information calculated for the information bits for the coded bits.

The input of the turbo decoder is the received distorted signal $y_i$ from which the channel correction signal $\tilde{y}_i$ (an estimation of the ISI channel output given $\hat{s}_{i-1}, \hat{s}_{i-2}, \ldots, \hat{s}_1$) is subtracted to substantially obtain the desired AWGN-only corrupted input signal $x_i$. An advantage of the present invention is that the DFE 100 involves each iteration, after the first iteration, of the decoding so that the performance of the turbo decoder serves to greatly improve ISI performance. In addition, the DFE 100 is provided with a more accurate feedback decision by being in the iterative loop of the turbo decoder.

In operation, the DFE 100 is initialized with all-zero input such that $\tilde{y}_i=0$ and $x_i=y_i$ in the first iteration. The input is deinterleaved ($\pi_c^{-1}$) and demultiplexed in a serial-to-parallel transform to provide the samples $x_k^s$, for information bits, $x_k^{p1}$ and $x_k^{p2}$, for coded bits, which are applied to the recursive decoders as described previously. After the first iteration, the hard decision of both the information bits and coded (parity) bits are calculated by the turbo decoder as follows. A LLR value of the information bits are calculated as in the prior art. In addition, the LLR value of the coded (parity) bits is also calculated. The present invention uses the LLR value of the coded bits so that hard decisions based on that LLR value can be supplied to the DFE. However, in the present invention the $\alpha$, $\gamma$ and $\beta$ parameters which were used in the LLR calculation from the information bits are utilized in calculating the LLR value for the coded bits, resulting in a negligible increase in complexity.

Given that $u=\{u_1, \ldots, u_N\}$ is the decoder input, where N is the frame size, and $p_{.k}$ is the parity bit at time k, the LLR value of $p_{.k}$ based on the observation u is:

$$L(p_{.k}) = \ln\frac{p(p_{.k}=1|u)}{p(p_{.k}=0|u)} = \ln\frac{p(p_{.k}=1,u)}{p(p_{.k}=0,u)} \tag{5}$$

We note that for i=0,1, $$p(p_{.k}=i,u) = \sum_{\substack{(n,m) \\ p_{.k}=i}} p(n,m,u) \tag{6}$$

The summation is over all the transitions, from state n to state m at time k, of the encoder trellis with the coded bit output $p_{.k}=i$. Following the same derivation as above, $$p(n,m,u)=\alpha_{k-1}(n)\gamma_k(n,m)\beta_k(m) \tag{7}$$

where the $\alpha$, $\gamma$ and $\beta$ parameters are those previously calculated for the information bits. For simplicity, the note u has been dropped in all these parameters. Therefore, the LLR values for the coded bits, $L(p_{.k})$, are obtained in the same way as the LLR values for the information bits, $L(b_k)$, except the summation is calculated over a different group of transitions.

We denote the hard decisions of the information bits and parity bits as $\hat{b}_k$, $\hat{p}_{1k}$ and $\hat{p}_{2k}$, respectively, which are determined by the following equation.

$$\hat{c}_k = \begin{cases} 1 & \text{if } L(c_k) \geq 0 \\ 0 & \text{if } L(c_k) < 0 \end{cases} \tag{8}$$

where $c_k$ represents either $b_k$ or $p_{.k}$. It should be pointed out that the output of a regular turbo decoder is usually LLR and one needs an additional slicer to perform the hard decision as specified in equation (8). However, for simplicity, such a slicer is included inside the turbo decoder depicted in FIG. 5, so that the hard decisions are directly sent out from the corresponding constituent decoder. The hard decisions, $\hat{b}_k$, $\hat{p}_{1k}$ and $\hat{p}_{2k}$, are then multiplexed and mapped to channel symbols as $$\hat{s}_i = \begin{cases} 1 & \text{if } c_k = 0 \\ -1 & \text{if } c_k = 1 \end{cases}$$

Figure 6:
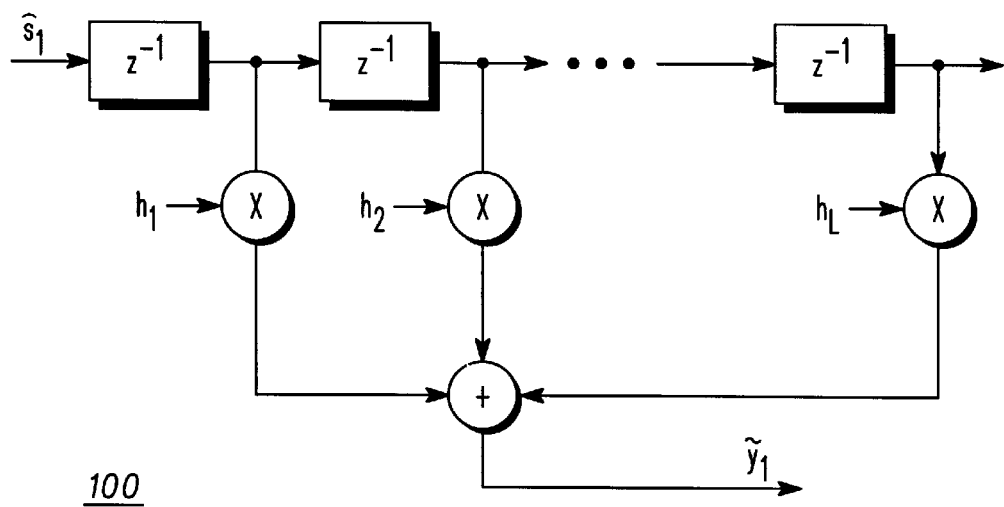
FIG. 6 shows simplified block diagram for the decision feedback equalizer of FIG. 5.

The estimated symbol $\hat{s}_i$ is channel interleaved and fed into the DFE. The output of the DFE, $\hat{y}_i$, which is calculated according to the channel model and the decision feedback sequence (shown in block form in FIG. 6) by $$\tilde{y}_i = \sum_{j=1}^{L} h_j \hat{s}_{i-j} \tag{9}$$

is applied to the input of the decoder such that the input of the decoder becomes $$x_i = y_i - \tilde{y}_i = h_0 s_i + n_i + \sum_{j=1}^{L} h_j(s_{i-j} - \hat{s}_{i-j})$$

It is obvious that the input of the decoder $x_i$ becomes $h_0 s_i + n_i$, with the AWGN-only corrupted signal scaled by $h_0$ if the estimated symbols are correct, i.e., $s_i = \hat{s}_i$, for any i. In practice, the estimated symbols can not be all correct, but due to the very large turbo coding gain and the fact that the DFE is implemented in the feedback loop, the symbol error probability becomes smaller and smaller as the iteration going on. Therefore, the ISI can be significantly suppressed in an iterative fashion which is in accordance with turbo decoding procedure and consequently needs only slightly more computation effort.

In practice, ISI channels may change in time. To ensure a good performance, the DFE should be able to track this variation. There are many existing methods in the literature to achieve this DFE update. The simplest but efficient one is least mean squared (LMS) error algorithm that can be briefly described as the following. Let $h(i)=(h_1(i),h_2(i), \ldots, h_L(i))$ denote the DFE coefficients at time i, and $\hat{s}(i)=(\hat{s}_{i-1},\hat{s}_{i-2}, \ldots, \hat{s}_{i-L})$ represent the contents of the tapped delay line in the DFE at time i, then DFE coefficients at time i+1 can be $$h(i+1)=h(i)+\Delta \epsilon \hat{s}(i) \tag{10}$$

where $\Delta$ is the adaptation stepsize, $\epsilon$ represents equalization error. For a detailed description, reference John G. Proakis, *Digital Communications,* McGraw Hills, second edition.

Figure 8:
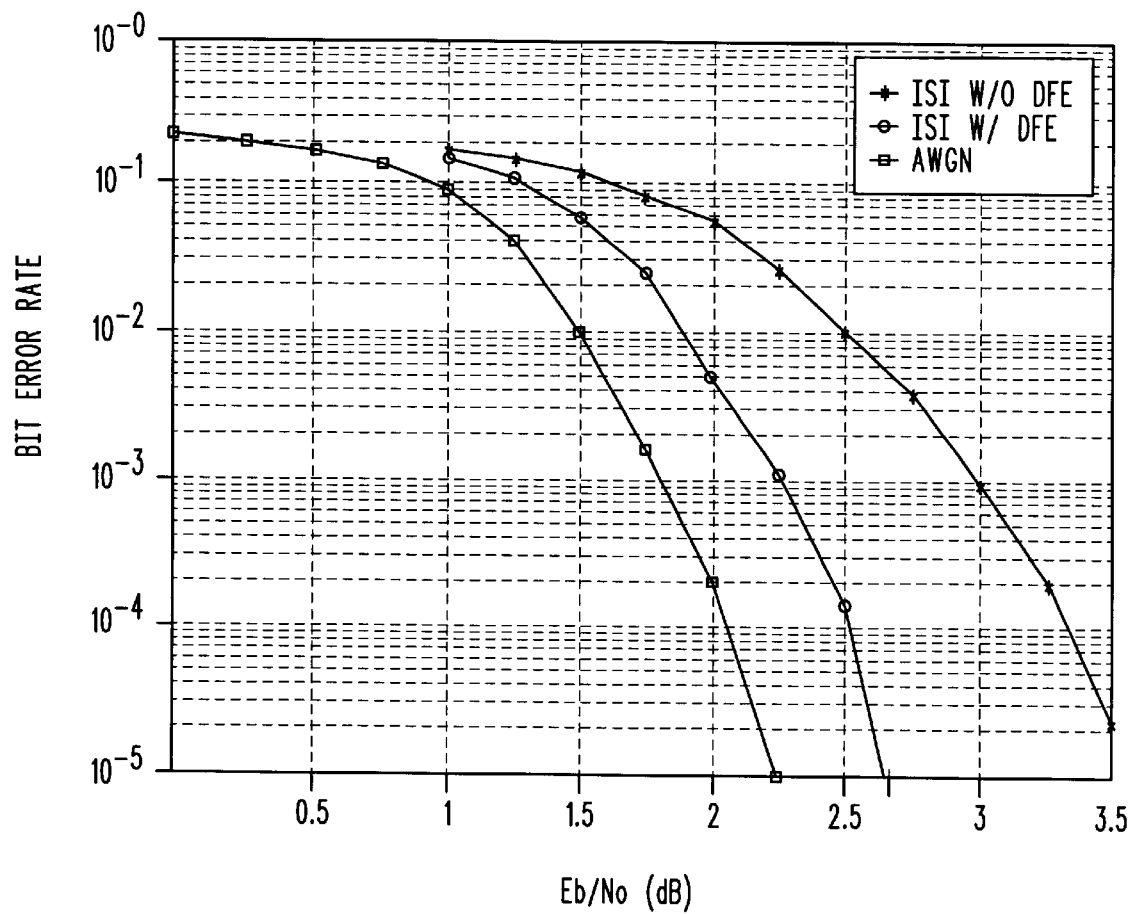
FIG. 8 shows a graphical representation of the improvement provided by the present invention.

FIG. 8 shows simulation results using the turbo decoding with decision feedback equalization of the present invention. The first curve from the right shows the bit error rate of a turbo decoder decoding signals with ISI but without using DFE. The second curve from the right shows the bit error rate for the case where DFE is combined with the turbo coder in the presence of the same ISI. The third curve from the right is a reference curve for the case where a turbo decoder is used when the channel is only a AWGN channel without ISI, but the signal is scaled by a factor of $h_0$.

As can be seen, at a BER of $10^{-4}$, the present invention using DFE provides about 0.8 db improvement over a turbo decoder without DFE, and at the BER level of $10^{-5}$ the difference is even more, about 1.0 db. On the other hand, the difference between the curve using DFE and the reference curve is only 0.4 db at a BER of $10^{-4}$ and 0.35 db at a BER of $10^{-5}$. Moreover, the equalization is accomplished with a minimum of added complexity as it is applied within an iterative loop of the turbo decoder.

Figure 7:
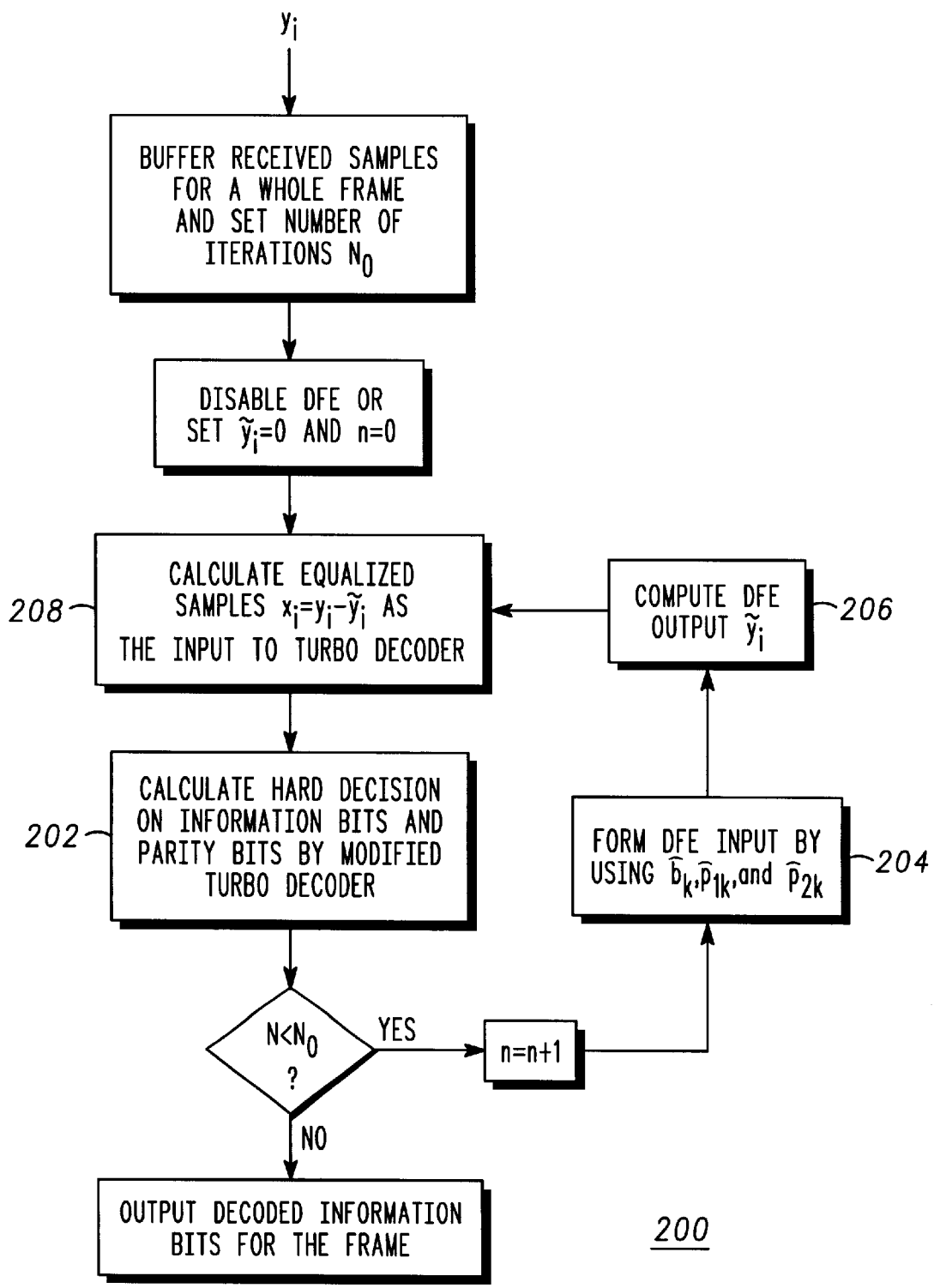
FIG. 7 shows a method for turbo coding with equalization, in accordance with the present invention.

FIG. 7 shows a flow chart representing a method 200 of decoding a received turbo coded signal with intersymbol interference using turbo decoding with decision feedback equalization, in accordance with the present invention. A first step of the method is providing a turbo decoder (as shown in FIG. 5) having two recursion processors connected in an iterative loop. The turbo decoder decodes the information bits and the coded bits of the input signal and calculates soft output values for the information bits and coded bits of the input signal. Typically, the coded bits are parity bits that may or may not be punctured, and the soft output values are LLR values. Preferably, the recursion updates and soft outputs are calculated using a MAP algorithm or one of the MAP derivatives (i.e., log-MAP, max-log-MAP, constant-log-MAP, etc.), or a SOVA or Viterbi algorithm. After some initialization, a next step 202 includes calculating hard decision values based on the soft output values from the turbo decoder. Preferably, the recursion processors of the turbo decoder are modified to provide hard decision values of the coded bits and information bits. After a check to see if the iterations are completed, i.e. a predetermined number of iterations have been performed (typically four to eight), a next step 204, which may be optional, includes updating and determining intersymbol interference equalization coefficients from the hard decision values. A next step 206 is applying the equalization coefficients to multiplexed and interleaved hard decision values to provide an ISI compensation correction signal. A next step 208 is equalizing the intersymbol interference of the input signal using the correction signal from the applying step and combining it with the input to minimize ISI. In a preferred embodiment, the steps of the method 200 occur synchronously with each other in an iterative loop therefore without introducing additional delay, which is a processing advantage of the present invention. This can be accomplished by using the $\alpha$, $\beta$ and $\gamma$ calculated for information bits for the calculation of the LLR for the coded bits.

While specific components and functions of the turbo decoder with ISI equalization are described above, fewer or additional functions could be employed by one skilled in the art within the broad scope of the present invention. The invention should be limited only by the appended claims.

What is claimed is:

1. A decoder that provides intersymbol interference equalization in decoding a received turbo coded signal, the decoder comprising:

a turbo decoder with two recursion processors connected in an iterative loop, the turbo decoder for decoding information and coded bits of the signal; and an equalizer feedback loop coupled to the turbo decoder and adapted to receive hard decision values for the coded and information bits from the turbo decoder, the feedback loop includes a decision feedback equalizer that inputs the hard decision values along with estimates for channel characteristics derived and updated from the previous frame to calculate an intersymbol interference correction signal, the decision feedback signal applies a correction to the next input of the signal before being input to the turbo decoder so as to minimize the intersymbol interference.

2. The decoder of claim 1, wherein the equalizer is implemented in an iterative loop of the turbo decoder, and the values applied to the equalizer are calculated in each turbo decoding iteration.

3. The decoder of claim 1, wherein the coded bits are parity bits.

4. The decoder of claim 1, wherein the recursion processors use a decoding algorithm including one of the group of a MAP, MAP derivatives, SOVA, and Viterbi algorithm.

5. The decoder of claim 1, wherein the recursion processors use a LLR value calculated for the coded bits to derive a hard decision value that is applied to the equalizer.

6. The decoder of claim 5, wherein the LLR coefficients for the information bits are used in the LLR calculation for the corresponding coded bits.

7. A decoder that provides intersymbol interference equalization for a received turbo coded signal, the decoder comprising:

a turbo decoder with two recursion processors connected in an iterative loop, the turbo decoder for decoding information and coded bits of the received turbo coded signal; and an iterative equalizer feedback loop coupled to the turbo decoder and adapted to receive hard decision values for the coded and information bits calculated in each turbo decoding iteration from the turbo decoder, the feedback loop includes a decision feedback equalizer that inputs the hard decision values along with estimates for channel characteristics derived and updated from the previous frame to calculate an intersymbol interference correction signal, the decision feedback equalizer applies the intersymbol interference correction signal to correct the next input of the received turbo coded signal before being input to the turbo decoder so as to minimize the intersymbol interference.

8. The decoder of claim 7, wherein the coded bits are parity bits.

9. The decoder of claim 7, wherein the recursion processors use a decoding algorithm including one of the group of a MAP, MAP derivatives, SOVA, and Viterbi algorithm.

10. The decoder of claim 7, wherein the recursion processors use a LLR value calculated for the coded bits to derive a hard decision value that is applied to the equalizer.

11. The decoder of claim 10, wherein the LLR coefficients for the information bits are used in the LLR calculation for the corresponding coded bits.

12. The decoder of claim 7, wherein the equalizer of the feedback operates on multiplexed and interleaved symbols constructed from the hard decisions of the coded and information bits to provide an equalization signal that is subsequently summed with the input signal and deinterleaved before application to the turbo decoder.

13. A method of equalizing intersymbol interference in a received turbo coded signal using decision feedback equalization, the method comprising the steps of:

providing a turbo decoder with two recursion processors connected in an iterative loop, the turbo decoder for decoding information and coded bits of the received turbo coded signal and calculating soft output values for the information bits and coded bits of the received turbo coded signal;

calculating hard decision values for the soft output values from the turbo decoder;

determining and updating intersymbol interference equalization coefficients from the hard decision values;

applying the equalization coefficients to multiplexed and interleaved hard decision values to provide a correction signal; and equalizing the intersymbol interference of the received turbo coded signal using the correction signal from the applying step.

14. The method of claim 13, wherein the providing, calculating, determining, applying and equalizing steps occur synchronously in said iterative loop.

15. The method of claim 13, wherein the coded bits of the providing step are parity bits.

16. The method of claim 13, wherein the providing step include decoding information using one of the iterative algorithms of the group of a MAP, MAP derivatives, SOVA, and Viterbi algorithms.

17. The method of claim 13, wherein the providing step includes calculating a LLR value for the coded bits.

18. The method of claim 17, wherein the providing step includes calculating said LLR value for the information bits and using those LLR coefficients calculated for the information bits to calculate a LLR value for the coded bits.

* * * * *